United States Patent [19]

Highton

[11] Patent Number: 4,692,641
[45] Date of Patent: Sep. 8, 1987

[54] LEVEL SHIFTING CIRCUITRY FOR SERIAL-TO-PARALLEL CONVERTER

[75] Inventor: Frederick J. Highton, Tucson, Ariz.

[73] Assignee: Burr-Brown Corporation, Tucson, Ariz.

[21] Appl. No.: 829,707

[22] Filed: Feb. 13, 1986

[51] Int. Cl.[4] .................. H03K 19/003; H03K 19/086; H03K 19/092; H03K 21/14
[52] U.S. Cl. .................... 307/475; 307/455; 307/467; 307/255; 377/73; 377/81; 323/316; 340/347 M
[58] Field of Search ............... 307/475, 455, 467, 355, 307/255, 264, 269, 272 R, 272 A; 377/71, 73, 75, 81; 340/347 M; 323/316

[56] References Cited

U.S. PATENT DOCUMENTS

| | | | |
|---|---|---|---|
| 3,649,844 | 3/1972 | Kroos | 307/216 |
| 3,700,931 | 10/1972 | Watkins et al. | 377/73 X |
| 3,742,466 | 6/1973 | Hamm et al. | 377/73 X |
| 4,167,727 | 9/1979 | Anderson et al. | 340/146.1 |
| 4,386,282 | 5/1983 | Scavuzzo | 377/81 |
| 4,408,134 | 10/1983 | Allen | 307/471 |
| 4,410,816 | 10/1983 | Kanai | 307/443 |
| 4,486,671 | 12/1984 | Ong | 307/264 |
| 4,488,063 | 12/1984 | Lee | 307/289 |
| 4,509,036 | 4/1985 | Furihata | 340/347 M |
| 4,554,541 | 11/1985 | Bielkevicius et al. | 377/75 X |
| 4,573,036 | 2/1986 | Wondra | 340/347 M X |
| 4,584,520 | 4/1986 | Vinn | 323/316 |
| 4,628,217 | 12/1986 | Berndt | 307/467 |
| 4,630,295 | 12/1986 | Kamuro et al. | 377/73 X |
| 4,642,482 | 2/1987 | Kasperkovitz et al. | 307/475 X |

Primary Examiner—Stanley D. Miller
Assistant Examiner—David R. Bertelson
Attorney, Agent, or Firm—Cahill, Sutton & Thomas

[57] ABSTRACT

A serial-to-parallel converter receiving a clock signal and continuous serial stream of input data, each having TTL logic levels, produces parallel outputs for driving current switches of a digital-to-analog converter (DAC). The data and clock signals each are converted to ECL logic levels by a pair of emitter-coupled differential lateral PNP transistors having their collectors coupled to a pair of NPN current mirror circuits, the outputs of which drive the bases and emitters of a pair of NPN emitter follower transistors, resulting in very high bandwidth operation. Master-slave ECL shift register bit outputs are directly coupled, without emitter followers, to ECL inputs of output latches that drive the DAC current switches, resulting in substantially reduced power consumption and chip area. Saturation of the emitter-coupled NPN transistors of the latch circuit is avoided by providing an upper supply voltage level for the load resistors of the master-slave shift register bits that is one diode drop lower than the upper supply voltage level for the load resistors of the latch circuit. A unique ECL one-shot circuit responds to an external latch enable control signal having TTL logic levels to produce internal complementary ECL enable signals that enable the output latches.

23 Claims, 7 Drawing Figures

LEVEL SHIFTING CIRCUITRY FOR SERIAL-TO-PARALLEL CONVERTER

BACKGROUND OF THE INVENTION

The invention relates to level shifting circuitry and other circuitry that is particularly useful in converting high speed streams of serial data having TTL logic levels to parallel signals that are suitable for driving current switches of a high speed digital-to-analog converter; the invention also relates to level shifting circuits that achieve high speed conversion of signals having TTL logic levels to corresponding signals having ECL logic levels and are capable of driving high capacitance loads.

High speed, low cost 16 bit digital-to-analog converters (DACs) are now commercially available. Low cost 16 bit digital-to-analog converters would find wider application if they could be economically connected to receive continuous, high speed serial streams of data having common TTL logic levels. An example of a high speed, low cost 16 bit digital-to-analog converter is the device marketed by the assignee having the part number PCM54.

There are certain applications in which high fidelity audio information is converted into a continuous serial digital format that is stored on an appropriate media, for example, on devices commonly known as "compact audio disks". When the audio disks are "played" on a suitable audio player, the serial digital stream of data is reproduced and fed into a suitable digital-to-analog converter to recreate the original high fidelity audio signals. Although the above-mentioned high speed, low cost 16 bit DAC is available, it must receive the digital information in the form of 16 bit digital words that are applied to its 16 digital inputs. Designing of a low cost serial-to-parallel converter capable of continuously applying 16 bit digital words to the digital inputs or bit current switches of the 16 bit DAC from the continuous, uninterrupted stream of serial digital data has produced a substantial challenge because of the conflicting requirements of very high speed operation and a low cost implementation.

The difficulties encountered in making a low cost serial-to-parallel converter to be included on a single bipolar integrated circuit chip with a digital-to-analog converter lead to a need to significantly reduce the complexity of prior serial-to parallel converter circuits. The internal circuit structure of the type of DAC referred to requires three power supplies, $+V_{CC}$, ground, and $-V_{CC}$, and the system requires that the digital inputs be TTL levels between $+V_{CC}$ and ground, but the bit switching circuitry of the DAC requires digital signals between the ground and $-V_{CC}$. This leads to the need to not only internally convert TTL input levels to ECL levels, but also leads to a need to have the internal ECL levels shifted between ground and $-V_{CC}$, if high speed ECL technology is to be used in implementing the desired serial-to-parallel conversion. The problems of both obtaining signal level shifting and conversion of the TTL clock and data signal levels present especially difficult design challenges. Although a variety of prior techniques are known for converting TTL input signals to voltage levels suitable for other logic families, such as the ECL, NMOS, and CMOS technologies, such prior techniques are deemed to be inadequate for meeting the present objectives of providing a low cost, high speed implementation of the needed serial-to-parallel converter.

SUMMARY OF THE INVENTION

Accordingly, it is an object of the invention to provide a low cost, high speed, serial-to-parallel converter capable of converting serial TTL input data and clock signals to a parallel 16 bit output suitable for driving bit current switches of a high speed 16 bit DAC, with sufficient speed to effectuate high fidelity reconstruction of serial input data representing a high fidelity audio analog input signal from which the serial data input stream was derived.

It is another object of the invention to provide a high bandwidth, low cost circuit for converting TTL input levels to ECL signal and clock voltages on high capacitance conductors.

It is another object of the invention to provide a technique for interconnecting stages of emitter-coupled logic circuitry without use of emitter followers while avoiding saturating emitter-coupled NPN transistors, thereof.

Briefly described, and in accordance with one embodiment thereof, the invention provides an integrated level shifting circuit for converting an input signal, which may have TTL logic levels, to corresponding output signals that may be complementary output signals having ECL levels, including a constant current source, first and second lateral PNP transistors having their emitters connected together and to the constant current source, a first diode having an anode coupled to the collector of one of the first and second lateral PNP transistors, respectively, and having its cathode coupled to a supply voltage conductor, a first NPN current mirror transistor having its emitter connected to the supply voltage conductor and its base connected to the anode of the first diode, a first pull-up resistor connected to the collector of the first current mirror transistors. In the described embodiment of the invention, a second diode has its anode connected to the collector of the other lateral PNP transistor and its cathode connected to the supply voltage conductor. A second NPN current mirror transistor has its base connected to the anode of the second diode. In one described embodiment of the invention, the collectors of the first and second current mirror transistors respectively conduct the complementary output signals. In another embodiment of the invention, first and second emitter followers are connected to the collectors of the first and second current mirror transistors, the complementary output signals being produced at the emitters of the emitter follower transistors of the first and second emitter followers. In the latter embodiment of the invention, a third NPN current mirror transistor has its emitter connected to the supply voltage conductor and its base connected to the base of the first current mirror transistor, and its collector connected to the emitter of the first emitter follower transistor. A fourth current mirror transistor has its emitter connected to the supply voltage conductor, its base connected to the base of the second current mirror transistor, and its collector connected to the emitter of second emitter follower transistor. Reduced power dissipation and more rapid rise times of the complementary output signals are thereby achieved, because the second and fourth current mirror transistors are turned off whenever the first and second emitter follower transistors, respectively, are supplying current to their respective output loads.

In another embodiment of the invention, a continuous serial stream of data pulses representing an analog signal is fed into a circuit including an N-bit digital-to-analog converter having N digital inputs and an output on which a reconstructed analog signal is to appear, N latch circuits, N-bit shift register including N master-slave bit circuits each having an output coupled to an input of a respective one of the latch circuits, circuitry responsive to a continuous clock signal for continuously clocking the master-slave bit circuits to advance the stream of data pulses forward through the N-bit shift register, a delay circuit having an output connected to the input of the first master-slave bit circuit for delaying the stream of data pulses by one-half of the period of the clock signal, and a latch enable pulse generating circuit for enabling the latch circuits to accept data stored in the slave stages of the N-bit shift register bit circuits every Nth pulse of the clock signal while the data stored in each of the slave stages of the N shift register bit circuits is stable. The master-slave shift register bit circuits are implemented by using conventional ECL master-slave shift register circuits, with their various load resistors being connected to an internal supply voltage conductor that is connected to the cathode of a power supply voltage level shifting diode, the anode of which is connected to another supply voltage conductor to which load resistors of the latch circuits are connected, the latch circuits also being ECL circuits. Direct connections, rather than emitter followers, are provided between the outputs of the slave stage of each master-slave shift register bit and the inputs of emitter-coupled transistors of the latch circuits. The one diode voltage level shift between the supply voltage of the latch circuit and the lower supply voltage of the master-slave shift register bits avoids saturation of the emitter-coupled input transistors of the latch circuits even though conventional emitter follower coupling therebetween is not utilized. The input level shifting circuit is used to convert TTL logic levels of the data input signals, the continuous clock input signal, and a latch enable control signal to internal complementary ECL levels received by the ECL delay circuit, the latch enable pulse generating circuit, and the master-slave shift register bit circuits, and the latch circuits.

DESCRIPTION OF THE INVENTION

Figure 1:
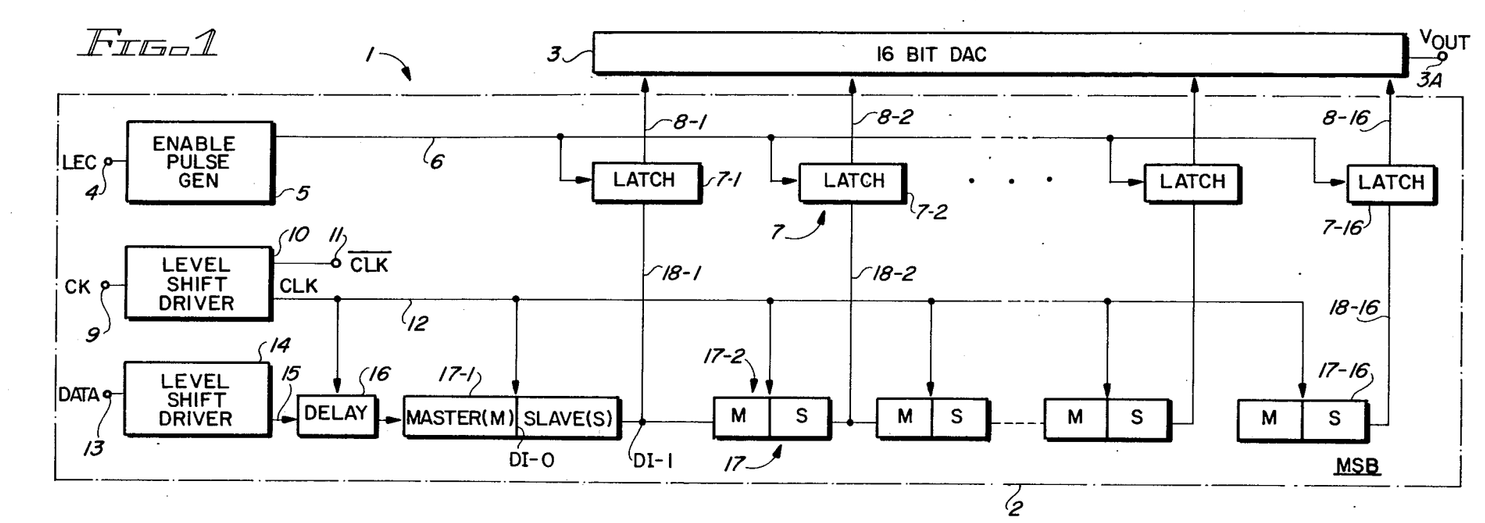
FIG. 1 is a block diagram of the serial-to-parallel converter of the present invention, connected to drive the current switches of a 16 bit digital-to-analog converter.

Referring now to FIG. 1, system 1 includes a high speed serial-to-parallel converter 2 connected to the 16 digital inputs of a high speed 16 bit digital-to-analog converter 3. Sixteen bit digital-to-analog converter 3 can be quite similar to a Model PCM54 presently marketed by Burr-Brown Corporation, the present assignee. Various details of the implementation of digital-to-analog converter 3 are found in co-pending patent applications Ser. Nos. 732,168, 732,229, and 732,162, by Naylor et al., all filed on May 8, 1985 and assigned to the present assignee, and incorporated herein by reference.

Serial-to-parallel converter 2 includes an input terminal 4 receiving a Latch Enable Control input signal LEC applied to an input of a pulse enable generator circuit 5. Pulse enable generator circuit 5 produces a pair of complementary latch enable output signals EN and EN*, which are both represented by conductor 6 in FIG. 1, and by conductors 6A and 6B in FIGS. 3 and 5. (Note that an * is utilized to designate logical complements of logic signals herein, because the printer being used is incapable of overscoring the name of a logic variable.) The two EN and EN* conductors 6 are applied to corresponding inputs of each of 16 latch circuits 7-1, 7-2 . . . 7-16, collectively referred to by reference numeral 7. Each of the latch circuits 7-1 . . . 7-16 produces an output 8-1, 8-2 . . . 8-16, respectively, connected to a corresponding digital input of the 16 bit digital-to-analog converter 3. (Those skilled in the art, upon noting that ECL (emitter-coupled logic) circuitry is utilized to implement the delay, master-slave shift register bit, and latch circuits, immediately will recognize that complementary logic signals and clock signals are used throughout such ECL circuitry, and will not be confused by the representation of complementary pairs of signal conductors by a single conductor as shown in the block diagram of FIG. 1.)

Serial-to-parallel converter circuit 2 includes a Clock Input signal CK applied to an input conductor 9 of a level shift/driver circuit 10. The circuit in block 10 produces a signal CLK on conductor 12 and its logical complement signal CLK* on conductor 11. The CLK and CLK* conductors 12 and 11, respectively, each are connected to the clock inputs of an ECL delay circuit 16 and to each of 16 ECL master-slave flip-flop shift register bit circuits 17-1, 17-2 . . . 17-16.

The slave stage S of each of the master-slave shift register bit circuits 17-1 . . . 17-16 is connected by a pair of conductors 18-1, 18-2 . . . 18-16 to inputs of latch circuits 7-1, 7-2 . . . 7-16, respectively.

Figure 3:
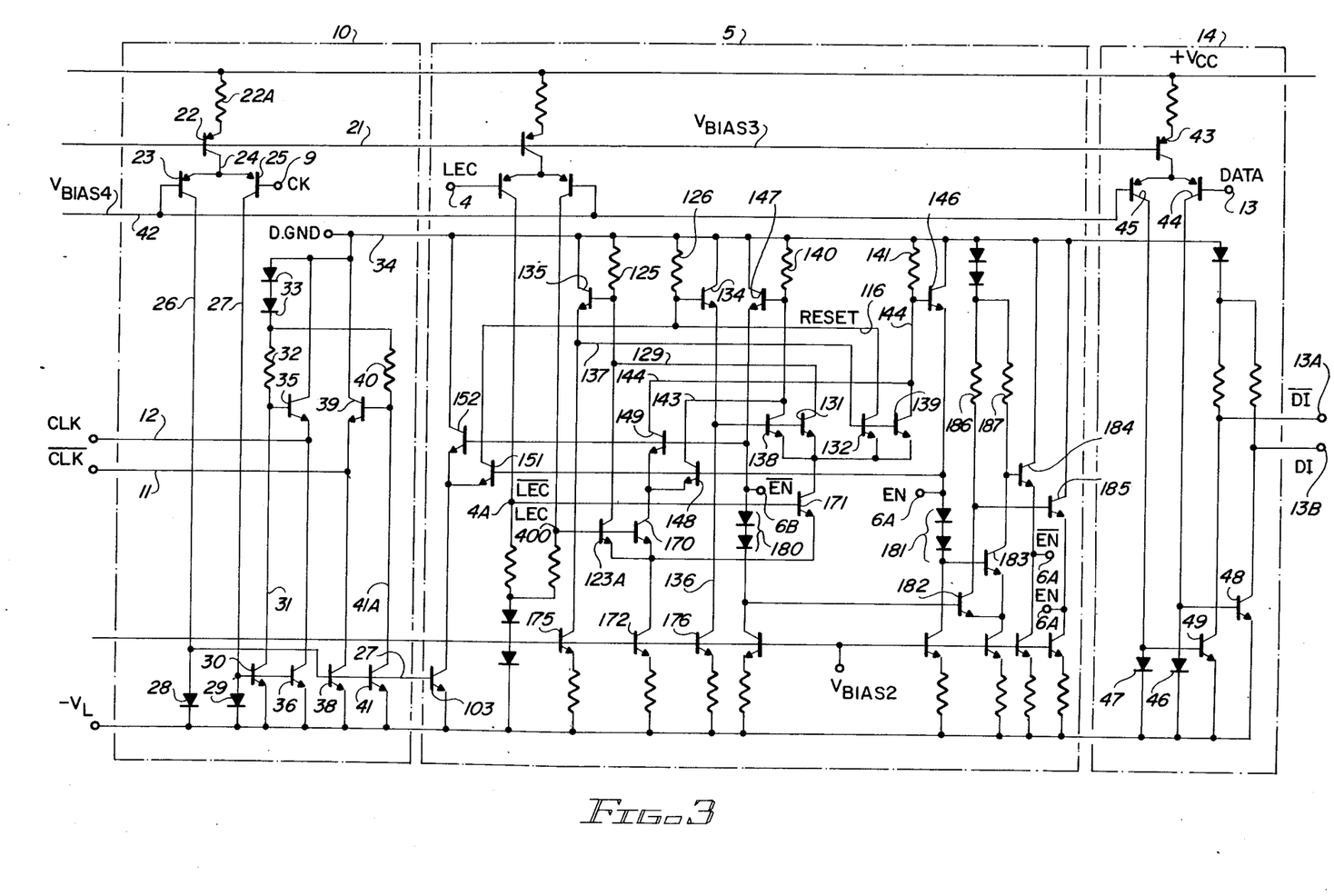
FIG. 3 is a detailed schematic circuit diagram showing the TTL-to-ECL input level shifter of the present invention and also illustrating a latch enable driver circuit of the present invention.

Serial-to-parallel converter 2 includes a serial data input signal DATA applied to an input conductor 3 of a level shifter and driver circuit 14, which produces complementary data output signals DI and DI* on a pair of conductors collectively referred to by reference numeral 15 in FIG. 1 and individually referred to by reference numerals 15A and 15B, respectively, in FIG. 3. The conductors 15 are applied to inputs of an ECL delay circuit 16. The output of delay circuit 16 is applied to the master stage M of an ECL master-slave shift register bit circuit 17-1. The output of the slave section S thereof is applied by a pair of complementary conductors 18-1 to the master stages of shift register bit circuit 17-2. The remaining bits 17-3 to 17-16 of the shift register, collectively referred to by reference numeral 17, are similarly connected together.

Figure 2:
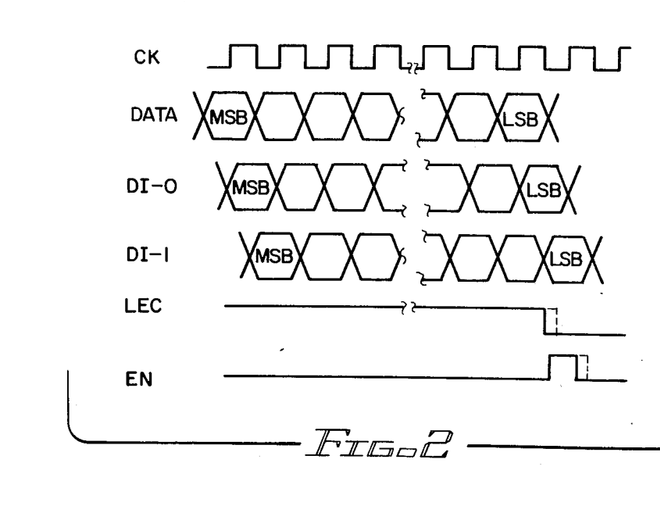
FIG. 2 is a diagram showing waveforms useful in describing the operation of the circuit of FIG. 1.

FIG. 2 shows the timing of the above-mentioned signals. A clock signal CK on conductor 9 has standard TTL levels. The frequency of the signal CK can be from about 2 to 10 megahertz for the described embodiment of the invention. The DATA input on conductor 13 also has standard TTL logic levels and half of the frequency of the external clock signal CK. The level shifter/driver circuit 14 shifts the TTL data signal levels down to a range near $-V_{CC}$, and then converts the shifted levels to ECL logic levels between ground and $-V_{CC}$. The ECL "delay" circuit 16, in accordance with the present invention, allows a delay of one-half of a period of the clock signal CK, for reasons explained subsequently. The output of delay circuit 16 causes the waveform DI-0 to appear at the output of the master stage of master-slave flip-flop 17-1. The output of the slave stage of flip-flop 17-1 is the signal DI-1. The latch enable control signal LEC also has TTL logic levels, which are converted to a pair of complementary ECL logic level signals EN and EN* on conductors 6A and 6B, respectively, in FIG. 3 by enable pulse generator 5. Conductors 6A and 6B are collectively referred to by reference numeral 6 in FIG. 1.

The dotted lines shown in the LEC and EN waveforms of FIG. 2 indicate uncertainty in the timing thereof. Such uncertainty must be allowed for by the circuitry of the present invention in order to avoid loss of data.

Next, the structure and operation of the level shifter/driver circuit 10 will be described with reference to FIG. 3. Level shifter/driver circuit 10 includes a pair of lateral PNP transistors 23 and 25 having their emitters connected by conductor 24 to the collector of a lateral PNP current source transistor 22. The emitter of PNP transistor 22 is connected by a 1 kilohm resistor to a $+V_{CC}$ conductor, which may be at +5 volts. The base of PNP transistor 22 is connected to a suitable bias voltage $V_{BIAS3}$, which can be supplied easily by conventional bias circuitry.

The base of PNP transistor 25 is connected to the CK data input conductor 9. The collector of PNP transistor 25 is connected by conductor 27 to the anode of a diode 29 having its cathode connected to a negative voltage conductor with a negative voltage $-V_L$, which can be $-5$ volts. Conductor 27 is also connected to the base of NPN current mirror transistors 30 and 36.

The base of PNP transistor 23 is connected to a bias voltage $V_{BIAS4}$ on conductor 42. The collector of PNP transistor 23 is connected by conductor 26 to the anode of a diode 28 and to the bases of NPN current mirror transistors 38, 41 and 103. The cathode of diode 28 is connected to $-V_L$. Those skilled in the art can easily provide a circuit to generate $V_{BIAS4}$, so the details are not provided. The collector of NPN current mirror transistor 30 is connected by conductor 31 to the base of an NPN emitter follower transistor 35 and one terminal of a 1.5 kilohm pull-up resistor 32. The emitter of NPN emitter follower transistor 35 is connected by CLK conductor 12 to the collector of NPN current mirror transistor 36. The collector of emitter follower transistor 35 is connected to digital ground conductor 34. The upper terminal of pull-up resistor 32 is connected to the cathode of the lower of two series connected diodes 33, the anode of the upper diode 33 being connected to digital ground conductor 34.

The collector of NPN current mirror transistor 38 is connected by CLK* conductor 11 to the emitter of NPN emitter follower transistor 39. The collector of NPN current mirror transistor 41 is connected to the base of transistor 39 and to the lower terminal of pull-up resistor 40, the upper terminal of which is connected to the upper terminal of pull-up resistor 32. The collector of transistor 39 is connected to digital ground conductor 34.

In operation, if the CK signal on conductor 9 undergoes a positive transition from a TTL "zero" level of 0 to 0.8 volts to a "one" level of +2.0 to +5 volts, PNP transistor 25 turns off, switching the constant current supplied by transistor 22 from transistor 25 to PNP transistor 23, and causing the switched current to flow through diode 28. According to my simulations, the current through diode 28 increases forward voltage drop from about 0.600 volts to about 0.72 volts, thereby causing the voltage on conductor 26 to increase by about 120 millivolts to about 720 millivolts above $-V_L$, as shown by the $V_{26}$ waveform in FIG. 4. (Note that the low 0.600 volt forward drop of diode 28 when the constant current is largely flowing through PNP transistor 25, rather than 23, is caused by the fact that lateral PNP transistor 23 is not entirely turned off (because of its transition capacitance) and by a current due to the removal of stored charge from the bases of transistors 38, 41, and 103.)

Figures 4, 5:
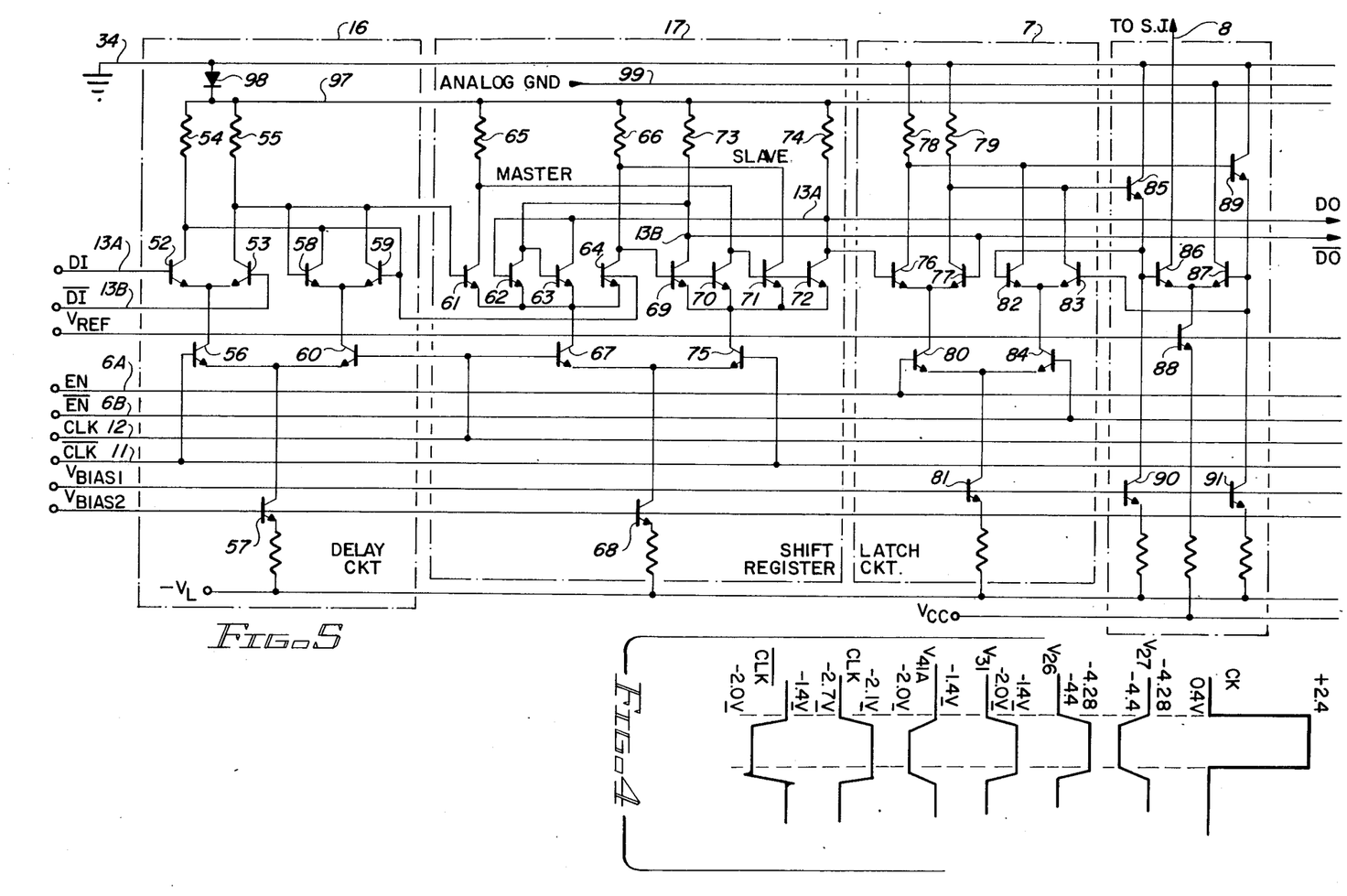
FIG. 4 is a diagram of waveforms useful in explaining the operation of the TTL-to-ECL level shifting circuit contained in FIG. 3.
FIG. 5 is a detailed circuit schematic diagram illustrating a master-slave shift register bit, a latch circuit, an input delay circuit, and a latch enable control circuit used in the circuit of FIG. 1.

Simultaneously, the corresponding reduction in current flowing through PNP transistor 25 and conductor 27 causes a reduction in the forward drop across diode 29 from about 720 millivolts above $-V_L$ to about 600 millivolts above $-V_L$, as indicated by the $V_{27}$ waveform in FIG. 4.

This decrease in $V_{27}$ turns NPN current mirror transistors 30 and 36 off, causing the voltage $V_{31}$ on conductor 31 to increase to a level two diode drops below digital ground voltage on conductor 34, as a result of the decreased current in pull-up resistor 32. The signal CLK on conductor 12 "follows" $V_{31}$ but is lower by the $V_{BE}$ voltage of emitter follower transistor 35. Similarly, but in a complementary fashion, the increase of $V_{26}$ causes current mirror transistors 38 and 41 to turn on. Pull-up resistor 40 causes the voltage $V_{41A}$ on conductor 41A to fall.

Of course, if the CK signal undergoes a negative transition from +2.4 volts down to 0.4 volts, the operation of level shifter/driver circuit 10 is entirely similar to, but complementary to that described above, as also indicated by the trailing edges of the various waveforms shown in FIG. 4.

A surprisingly high frequency response is obtained the level shifting circuit 10, despite the notoriously poor frequency response that is usually obtained for lateral PNP transistors connected in the manner of lateral PNP transistor 23 and 25 as shown in FIG. 3. My simulations and experiments have shown that, much to my surprise and the surprise of my co-workers, that the level shifting circuit 10 effectively shifts the CK signal to produce the CLK and CLK* signals on conductors 12 and 11, respectively, at frequencies up to about 10 megahertz. I believe that this unexpectedly high frequency is a result of gain in the NPN current mirror circuit which to a considerable extent makes up for the attenuation of the input signal caused by the low frequency of the lateral PNP transistors 23 and 25.

An unexpected benefit of the circuit 10 resulting from use of switching current mirror transistors 36 and 38 connected to the emitters of emitter follower transistors 35 and 39, respectively, is that faster rise times and fall times are obtained for the CLK* and CLK waveforms on conductors 11 and 12, respectively, even though the amount of power consumption of the circuit is substantially reduced. For example, if $V_{31}$ rises, causing emitter follower transistor 35 to pull the CLK signal on conductor 12 from a "zero" level to a "one" level, and there is a large (low impedance) load connected to conductor 12, the fact that current mirror transistor 36 is turning off at about the same rate as NPN current mirror transistor 30, allows the nearly entire output current supplied by the emitter of transistor 35 to flow to the load; i.e., little of the current goes to current mirror transistor 36. In contrast, in a typical emitter follower circuit, either a resistor or a constant current source transistor would be connected to the emitter of the NPN transistor 35 thereof, and a substantial portion of the output current supplied by the emitter of transistor 35 would flow into that resistor or constant current source, reducing the amount of output current supplied to the load, and reducing the rise time of the CLK signal.

Conversely, when $V_{31}$ falls, NPN current mirror transistor 36 turns on at the same rate as NPN current mirror transistor 30, thereby drawing current from the load connected to conductor 12 as effectively as a constant current source.

As mentioned above, the "high" or "one" logic levels of CLK and CLK* on conductors 12 and 11, respectively, are determined by the forward drops of diodes 33 and the $V_{BE}$ voltages of transistors 35 and 39. The "zero" levels of CLK and CLK* are not critical, but can be adjusted by the ratio of resistor 32 to resistor 22A and by the ratio of resistor 40 to resistor 22A.

The structure and operation of the data level shifter/driver circuit 14 is essentially similar to that described for level shifter/driver circuit 10, and will not be repeated. For completeness, however, the configuration of circuit 14 is shown in FIG. 3, and includes PNP current source transistor 43, emitter-coupled lateral PNP transistors 44 and 45, the collectors of which are connected to diodes 46 and 47, respectively, and to the bases of current mirror transistors 48 and 49, respectively. The collectors of the current mirror transistors 48 and 49 can be connected directly to the DI and DI* conductors 13A and 13B, respectively, if the loading is not too great. Although emitter follower outputs are not used for this circuit because the capacitive loads on conductor 13A and 13B are low, the same high frequency performance is obtained as for level shifter/driver circuit 10, despite the very low bandwidth of the lateral PNP transistors 23 and 25 because of the gain of the current mirror transistors 48 and 49.

Next, the structure and operation of the latch enable circuit 5 will be described with reference to FIG. 3.

Figures 6, 7:
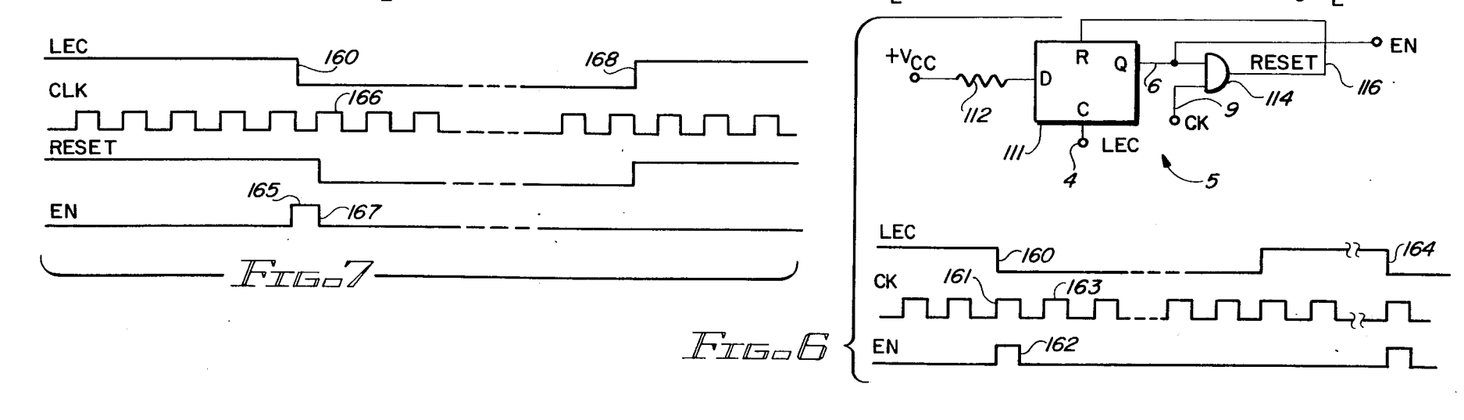
FIG. 6 is a block diagram of the latch enable pulse generator circuit 5 of FIG. 1.
FIG. 7 is a circuit schematic of a non-inventive ECL implementation of the circuit shown in FIG. 6, useful in contrasting the inactive latch enable pulse generator circuit contained in FIG. 3 with conventional ECL circuit design techniques.

Before describing in detail the structure and operation of the enable pulse generator circuit 5 in FIG. 3, it will be helpful to first refer to FIG. 6, which shows a functional block diagram and accompanying waveforms. In FIG. 6, a master-slave flip-flop 111 has its data input D coupled by a resistor 112 to $+V_{CC}$, thus ensuring that a logical "1" will always be applied to the input of master-slave flip-flop 111. The clock input of master-slave flip-flop 111 shifts data from its master stage to its slave stage upon the occurrence of a negative-going edge of the LEC waveform. The Q output of master slave flip-flop 111 is connected to enable (EN) conductor 6, which is also connected to one input of a two-input AND gate 114. The other input of AND gate 114 is coupled by conductor 9 to the CK signal. The output of AND gate 114 is connected by conductor 116 to the reset input R of master-slave flip-flop 111.

The operation of the enable pulse generator circuit 5 is that the negative edge 160 of the LEC (latch enable control) waveform causes a logical "1" to appear on conductor 6, thereby producing EN pulse 162. As soon as the CK pulse 161 appears on conductor 9, the "1" level on conductor 6 is gated via conductor 116 to the reset input R, causing the Q output of master-slave flip-flop 111 to return to a "0" level, i.e., causing the EN pulse to return to a "0" level. Further clock pulses such as 163 accomplish nothing until another negative-going edge such as 164 occurs on the LEC waveform. Thus, the overall operation of the enable pulse generator circuit 5 is that the negative edge of the LEC waveform produces a single short duration EN pulse such as 162.

Next, I will describe in FIG. 7 what I consider to be a "conventional" approach to an ECL implementation of the circuit shown in FIG. 6. Emitter-coupled NPN transistors 123 and 124 are the "input" transistors of the "master" stage of master-slave flip-flop 111. The permanent logical "1" desired to be input to the master-slave flip-flop, for an ECL implementation, requires an ECL logical "1" level to be applied to the base of NPN transistor 123 and a logical complement ECL "0" level to be applied to the base of opposite NPN transistor 124. The two above permanent complementary ECL "1" and "0" input levels are produced by the circuitry including diode 120, resistor 121, and constant current source 122.

Load resistors 125 and 126 of master stage input transistors 123 and 124 are connected directly to the collectors of NPN "latch" transistors 131 and 132 by conductors 129 and 116, respectively. The collectors of master stage input transistors 123 and 124 also are coupled by emitter follower transistors 134 and 135 to the bases of master stage latch transistors 131 and 132 by conductors 136 and 137, respectively. The common emitters of master stage input transistors 123 and 124 are coupled by gating transistor 127 to a constant current source 128, while the emitters of master stage latch transistors 131 and 132 are also coupled by gating transistor 133 to constant current source 128. The bases of gating transistors 127 and 133 are connected to the LEC and LEC* waveforms on conductors 4 and 4A, respectively.

The complementary outputs of the master stage of flip-flop 111 appearing on conductors 136 and 137 are connected to the bases of slave stage input transistors 138 and 139, respectively. Load resistors 140 and 141 are connected to the collectors of slave stage input transistors 138 and 139, respectively, and also to the collectors of slave stage latch transistors 148 and 149, respectively. The collectors of slave stage input transistors 138 and 139 are connected by conductors 143 and 144 to the bases of emitter follower transistors 146 and 147, respectively. The emitters of emitter follower transistors 146 and 147 are connected by EN conductor 6A and EN* conductor 6B to the bases of slave stage latch transistors 148 and 149, respectively.

EN conductor 6A also is connected to the base of an NPN transistor 151, the emitter of which is connected to the emitter of NPN transistor 152, the base of which is connected to EN* conductor 6B. The collector of NPN transistor 151 is connected to RESET conductor 116, which is connected to the collector of master stage input transistor 124. The collector of transistor 152 is connected to $+V_{CC}$. The common emitters of transistors 151 and 152 are coupled by transistor 20 to a constant current source 155. The base of transistor 153 is connected to CLK conductor 12. The emitter of transistor 153 is coupled to the emitter of NPN transistor 154, the collector of which is connected to $+V_{CC}$ and the base of which is connected to CLK* conductor 11.

The common emitters of slave stage input transistors 138 and 139 are coupled by gating transistor 142 to constant current source 156. The base of transistor 142 is coupled to LEC* conductor 4A. The common emitters of slave stage latch transistors 148 and 149 are coupled by gating transistor 150 to current source 156. The base of transistor 150 is connected to LEC conductor 4.

I am describing the above "conventional" approach to implementing the enable pulse generator circuit of FIG. 6 because understanding of its operation will facilitate understanding of the operation of the latch enable circuit 5 in FIG. 3, which has some of the features of the conventional circuit 5A of FIG. 7, and also has some highly unconventional features.

The operation of the "conventional" circuit of FIG. 7 is as follows. Prior to the negative transition 160 of LEC, gating transistors 127 and 150 are on, while gating transistors 133 and 142 are off. The permanent input levels applied to the bases of master stage input transistors 123 and 124 cause transistor 123 to be on and transistor 124 to be off, if gating transistor 127 is on. The resulting low level on conductor 129 and the resulting high level on conductor 116 are presented to the bases of master stage latch transistors 131 and 132, respectively. The low level on conductor 129 and the high level on conductor 116 also are presented, after being buffered by emitter follower transistors 135 and 134, to the bases of slave stage input transistors 138 and 139, respectively.

The prior state in the slave stage is latched therein by gating transistor 150, since LEC is high. As will be seen subsequently, this prior state is that slave stage latch transistor 148 is off and slave stage latch transistor 149 is on, so that EN is low and EN* is high. This, in turn, causes transistor 151 to be off, so repetitive CLK pulses on conductor 12 simply gate the current of constant current source 155 through transistors 153 and 152, and thus have no effect on the reset conductor 116 or on the level of EN.

Now, when LEC undergoes negative transition 160, transistors 127 and 150 turn off, and simultaneously, transistors 133 and 142 turn on, thereby turning off the master stage input transistors 123 and 124, and also turning off the slave stage latch transistors 148 and 149. However, the voltages on conductors 129 and 116 initially remain at low and high levels, respectively. These levels are shifted down one $V_{BE}$ drop by emitter follower transistors 134 and 135. Since transistor 133 is now on, master stage latch transistor 131 is turned on, and master-stage latch transistor 132 remains off. Since transistor 142 is turned on, and the voltage on conductor 136 is at a high level, slave stage input transistor 138 is turned on, and slave stage input transistor 139 remains off. The voltage on conductor 143 therefore falls from a high level to a low level, presenting a low level to the base of slave stage latch transistor 149, while a high level is appearing on the collector of slave stage input transistor 139 and hence on the base or input of slave stage latch transistor 148.

The high level on conductor 144 results in a high level on EN conductor 6A, producing pulse 165. The high level on conductor 6A turns on transistor 151. The next CLK pulse 166 therefore results in the current of constant current source 155 being gated through transistor 153 and transistor 151, thereby producing the function of AND gate 114 in FIG. 6, and pulling the RESET conductor 116 low, as indicated by transition 166 in the RESET waveform of FIG. 7.

RESET conductor 116 going low causes conductor 136 to go from a high level to a low level, turning transistor 131 off, thereby switching transistor 132 on, which now holds the RESET waveform on conductor 116 low, and allows the voltage on conductor 129 goes high. The states of slave stage input transistors 138 and 139 are thereby reversed, since transistor 142 is still on. This causes the enable signal on conductor 6A to undergo a negative transition 167, which turns transistor 151 off, and also causes the EN* signal on conductor 6B to go high, turning transistor 152 on. Further CLK pulses on conductor 12 simply gate the current from constant source 155 through transistor 152, so that they have no further effect until another negative transition of LEC occurs which, of course, cannot happen until there is a positive transition such as 168.

The problem with the above conventional approach to implementing the circuit of FIG. 6 is that it requires 21 transistors and 8 constant current sources, plus diode 120, in addition to the load resistors, and therefore requires a lot of chip area and dissipates a lot of power.

With this background in mind, the enable pulse generator circuit 5 included in FIG. 3 will be described, with its novel features being compared to the circuitry in FIG. 7.

In FIG. 3, enable pulse generator circuit 5 includes NPN transistor 103, the emitter of which is connected to $-V_L$ and the base of which is connected to conductor 27 of clock level shift driver circuit 10, previously described. The collector of transistor 103 is connected to the common emitters of NPN transistors 151 and 152, which correspond to transistors 151 and 152 in FIG. 7. As in FIG. 7, the bases of transistors 151 and 152 are connected to EN conductor 6A and EN* conductor 6B, respectively. As in FIG. 7, conductor 6A is connected to a constant current source and to the emitter of emitter follower transistor 146, the base of which is coupled by conductor 144 to the collectors of NPN transistors 139 and 149 and load resistor 141, the other terminal of which is connected to digital ground conductor 34. (Note that two EN conductors 6A and two EN* conductors 6B are shown. The differential driver stage including diodes 180 and 181, emitter-coupled transistors 182 and 183, load resistors 186 and 187, and emitter followers 184 and 185 is not part of the inventive circuit, although it produces EN and EN* also.)

As in FIG. 7, EN* conductor 6B is connected to the emitter of NPN emitter follower transistor 147, the base of which is connected by conductor 143 to a lower terminal of load resistor 140 and to the collectors of NPN transistors 138 and 148.

Note that transistors 153, 154, and current source 155 of FIG. 7 have been omitted from enable pulse generator circuit 5 of FIG. 3.

In FIG. 3, master stage input transistors 123 and 124 of FIG. 7 have been omitted. Instead, the lower terminal of load resistor 125 is connected by conductor 129 to the base of NPN emitter follower transistor 135 and to the collector of slave stage NPN transistor 6, as in FIG. 7. However, conductor 129 now is connected to the collector of NPN transistor 123A, which is not connected to the input bias circuit including diode 120, resistor 121, and current source 122 as in FIG. 7, but instead is connected to LEC conductor 400. Diode 120, resistor 121 and current source 122 have been omitted. Transistor 127 of FIG. 7 also has been omitted, and its function and the functions of the input bias circuit have been filled by transistor 123A, the emitter of which is connected to the emitters of NPN gating transistors 170 and 171 and also to current source 172.

The emitter of emitter follower transistor 135 is connected by conductor 137 to the base of master stage latch transistor 132, as in FIG. 7 and also to the base of slave stage input transistor 139, as in FIG. 7. However, in FIG. 7, the emitters of master stage latch transistor 132 and the emitter of slave stage input transistor 139 were not commonly connected, but they are commonly connected in FIG. 3.

Next, the lower terminal of load resistor 126 is connected by RESET conductor 116 to the collector of transistor 151, as in FIG. 7, and also to the collector of master stage latch transistor 132 and to the base of emitter follower NPN transistor 134. The upper terminals of load resistors 125 and 126 are connected to digital ground conductor 34, as in FIG. 7. The emitter of emitter follower transistor 134 is connected by conductor 136 to a constant current source, and also is connected to the base of slave stage input transistor 138, as in FIG. 7, and also to the base of master stage latch transistor 131, as in FIG. 7. Note, however, that in FIG. 3, master stage latch transistor 131 and slave stage input transistor 138 have commonly connected emitters, whereas they do not in FIG. 7. In FIG. 3, the commonly connected emitters of transistors 131, 132, 138, and 139 all are connected to the collector of NPN gating transistor 171, the base of which is connected to LEC* conductor 4A, the emitter of which is connected to the emitters of transistors 123A and 170.

The emitters of NPN slave stage latch transistors 148 and 149 are connected to the collector of a new NPN gating transistor 170, the base of which is connected to LEC conductor 400. Gating transistor 170 replaces transistors 127 and 150 of FIG. 7. Gating transistor 171 of FIG. 3 replaces gating transistors 9 and 16 of FIG. 7. The single constant current 172 in FIG. 3 replaces constant current sources 128 and 156 in FIG. 7.

Thus, it can be seen that the circuit of FIG. 3 deletes quite a few transistors, several current sources, a diode, and a resistor, significantly reducing the amount of chip area required and the amount of power dissipated over that of the circuit of FIG. 7.

The operation of the circuit 5 of FIG. 3 can be described with reference to the same waveforms shown in FIG. 7.

As in FIG. 7, before LEC undergoes negative transition 160, transistor 123A is on, so the voltages on conductors 129 and 137 are at low levels, and the base of master stage latch transistor 132 is low. Since transistor 171 is off, transistors 131, 132, 138 and 139 all are off. As will become apparent, transistor 151 initially is off. Therefore, RESET conductor 116 is pulled high by resistor 126, so conductor 136 is high, and the bases of transistors 131 and 138 are high.

The slave stage latch transistors 148 and 149 will be storing the prior state of the slave stage, which, as in the circuit of FIG. 7, is a "0". Therefore, conductor 144 is held low because transistors 149 and gating transistor 170 both are on. Consequently, EN conductor 6A is low before negative transition 160 of LEC occurs.

Slave latch transistor 149 is held on by the high level of EN* conductor 6B, which is held high by emitter follower transistor 147 and load resistor 140, since transistor 138 is off. EN conductor 6A, being low, holds transistor 151 off. Consequently, repetitive CK pulses turning transistor 103 on repetitively will have no effect on reset conductor 116, which remains high.

Now, when negative-going transition 160 of LEC occurs, this turns transistors 123A and 170 off. Transistor 171 is turned on by LEC* The initial high level on RESET conductor 116 is maintained by load resistor 126. The high level on conductor 136 causes transistors 131 and 138 to turn on. The low level on conductor 129 remains low due to the current through transistor 131, which now is on.

The turning off of transistor 170 causes initially-on transistor 149 to turn off, allowing conductor 144 to rise, thereby producing the leading positive transition of EN conductor 6A, causing EN to rise to the level indicated by reference numeral 165 in the EN waveform of FIG. 7. This also raises the voltage of the base of transistor 151. The current through transistor 138 pulls down the voltage of conductor 143 as soon as transistor 171 turns on, immediately causing EN* conductor 6B to go low, lowering the base voltage of transistor 152.

This condition persists until the next CK pulse 166 arrives, turning on transistor 103. As soon as transistor 103 turns on, transistor 151 turns on, producing the ANDing function of gate 114 of FIG. 6, which is analogous to the ANDing function produced by transistors 153 and 151 in FIG. 7.

This causes RESET conductor 116 to undergo negative-going transition 166 in the waveform of FIG. 7, lowering the voltage on conductor 136 and turning transistors 131 and 138 off, switching the current of constant current source 172 through transistors 132 and 139, turning them on. This pulls the voltage of conductor 144 low, causing EN conductor 6A to undergo the negative transition 167 shown in the EN waveform of FIG. 7. The turning off of transistor 138 causes conductor 143 to be pulled high by load resistor 140, and emitter follower 147 simultaneously causing EN* conductor 6B to rise. Subsequent CK pulses that turn on transistor 103 cause transistor 152 to turn on, but transistor 151 remains off. The positive transition 168 of LEC turns off transistors 171, 131, 132, 138, and 139, and turns on transistors 123A and 170, latching the present levels of EN conductor 6A and EN* conductor 6B into the slave latch transistors 148 and 149. Continued CK pulses cause no change in the circuit until another negative-going transition such as 160 occurs in LEC.

Next, the structure and operation of one of the master-slave shift register bit circuits of shift register 17 and one of the latch circuits 7 will be described with reference to FIG. 5. In FIG. 5, reference numeral 34 again designates the digital ground conductor. It is connected to the upper terminals of load resistors 78 and 79, the lower terminals of which are connected to the collectors of emitter-coupled NPN transistors 76 and 77, respectively. The emitters of transistors 76 and 77 are connected to the collector of an "enable" transistor 80, the emitter of which is connected to the emitter of a second enable transistor 84. The collector of transistor 84 is connected to the emitters of NPN transistors 82 and 83, the collectors of which also are connected to 5 kilohm load resistors 78 and 79, respectively. Emitter-coupled NPN transistor pairs 76, 77 and 82, 83 comprise the two sides or current paths of latch circuit 7. The common emitters of enable transistors 80 and 84 are connected to an NPN constant current source transistor 81, the emitter of which is connected by a 1 kilohm resistor to $-V_L$ and the base of which is connected to a bias voltage $V_{BIAS1}$. It should be noted that the circuitry of latch 7 is conventional.

Next, refer to master-slave shift register circuit 17 in FIG. 5. The master stage of this conventional shift register bit includes emitter-coupled NPN transistors 61, 62, 63, and 64 having their collectors connected, respectively, to the lower terminals of 2.5 kilohm load resistors 65, 73, 74, and 66. The common emitters of NPN transistors 61, 62, 63, and 64 are coupled to the collector of NPN "clocking" transistor 67, the emitter of which is connected to constant current source NPN transistor 68, the emitter of which is coupled by a 500 ohm resistor to $-V_L$ and the base of which is connected to $V_{BIAS2}$. The slave stage of master-slave shift register bit 17 includes NPN transistors 69, 70, 71, and 72 having their collectors connected, respectively, to the lower terminals of 2.5 kilohm load resistors 73, 65, 66, and 74. The emitters of transistors 69, 70, 71, and 72 are connected to the collector of NPN "clocking" transistor 75, the emitter of which is connected to the collector of current source transistor 68.

The base of transistor 67 is connected to CLK and the base of transistor 75 is connected to CLK*. The bases of transistors 61 and 64 are connected to the complementary data outputs of delay circuit 16. The collector of transistor 62 is connected to the base of transistor 63. The bases of transistors 69 and 70 are connected to the collector of transistor 64. The bases of transistors 71 and 72 are connected to the collector of transistor 70.

It is especially noteworthy that the upper terminals of load resistors 65, 66, 73, and 74 are not connected to digital ground conductor 34, but instead are connected to a lower voltage conductor 97. Conductor 97 is connected to the cathode of level shifting diode 98, the anode of which is connected to digital ground conductor 34. Next, note that the outputs of the slave stage of shift register bit 17, which is connected to DO (data out) conductor 13A and DO* conductor 13B, are coupled "directly" to the inputs of latch circuit 7, without use of emitter follower coupling circuits, which are commonly used for coupling outputs of one ECL circuit to inputs of a successive ECL stage.

The voltages of the common emitters of transistors 76 and 77 are one $V_{BE}$ diode drop higher than would be the case if emitter follower circuits are used to couple the outputs of shift register bits 17 and the inputs of latch circuit 7. Such higher voltages increase the likelihood that transistors 76 and 77 might saturate, greatly reducing the speed of circuit operation that otherwise could be achieved.

In accordance with the present invention, the voltage on the upper terminals of resistors 78 and 79 now is one diode drop higher than is the voltage of the upper terminals of load resistors 65, 66, 73, and 74 of shift register bit 17. The $V_{BE}$ drop lost by omission of the emitter follower coupling stages is thereby "gained back". High speed operation without risk of saturating transistors 76 and 77 despite large signal swings is therefore achieved. As previously mentioned, it is known to direct couple cross-coupled stages of ECL circuitry in certain cases. In fact, the cross-coupled stages of shift register bit 17 do not have emitter followers interfaced therebetween.

The reason that direct coupling between the cross-couple stages of shift register bit 17 is ermissable is that the voltage swings at the lower terminals of load resistors 65, 66, 73, and 74 are designed to be only 250 millivolts, rather than the 400 millivolt voltage changes that are commonly used in ECL circuitry. The reduced 250 millivolt voltage swings reduce the likelihood of saturating the emitter-coupled NPN transistors in the shift register circuit, yet are adequate for the cross-coupled latching operation that occurs. 250 millivolt transitions are not, however, adequate to drive the DAC bit switches. The traditional 400 millivolt voltage swings and use of emitter follower buffers is usually essential in ECL to achieve adequate noise immunity. Within a single storage circuit, such as shift register bit 17, however, the speed requirements, the loading conditions, and the noise immunity requirements are such that the 250 millivolt voltage swings mentioned above can be used, allowing cross-coupling without emitter followers.

The output stage of latch circuit 7 can be considered to include NPN emitter follower transistors 85 and 89, the emitters of which are cross-coupled back to the bases of transistors 82 and 83, respectively. The emitters of transistors 85 and 89 also are connected to the bases of emitter-coupled NPN transistors 86 and 87, which form the bit switch of the DAC. The bit current, sourced by constant current source transistor 88, the base of which is connected to a reference voltage $V_{REF}$, is switched either via the collector of transistor 87 to an analog ground conductor 99 or the collector of transistor 86 to conductor 8 and thus eventually to the analog output.

In accordance with the present invention, delay circuit 16, the details of which are shown in FIG. 5, is provided in order to delay the DATA signal on conductor 13 by one-half of a CK pulse period. The LEC waveform of FIG. 2 is supposed to undergo a negative transition in a fixed amount of time after the trailing edge of the CK waveform. In a system in which the circuitry of FIG. 1 is used, the LEC is generated by an external circuit, and consequently there is an uncertainly of approximately one-fourth of a clock period between a trailing edge of the CK waveform and the negative-going edge of the LEC waveform. This results in the same uncertainty in the timing of the EN and EN* waveforms used to latch data from the slave stages of the master-slave shift register bits 17 into the latch circuit 7.

The negative-going edge of the LEC waveform (FIG. 2) occurs immediately after the negative-going edge of the CK pulse occurring after the least significant bit (LSB) of the DATA waveform has shifted into the slave stage of the "last" shift register bit 17-16. As a result of the above-mentioned uncertainty of the timing of the negative-going edge of the LEC waveform, there is not enough time to ensure that the EN pulse will be generated before occurrence of a transition of the data in the slave stages of the various shift register bit circuits The delay circuit 16 shown in FIG. 5, include emitter-coupled NPN transistors 52 and 53 having their emitters coupled by NPN transistor 56 to current source transistor 57, and having their collectors connected, respectively, to 2.5 kilohm load resistors 54 and 55, respectively. The base of NPN transistor 56 is connected to CLK* conductor 11. Delay circuit 16 also includes emitter-coupled NPN transistors 58 and 59, having their collectors connected, respectively, to load resistors 54 and 55. The emitters of transistors 58 and 59 are coupled to constant current source transistor 57 through NPN transistor 60. The base of NPN transistor 60 is connected to CLK conductor 11. It readily can be seen that this circuit causes the shifting of data from the master stage into the slave stage to occur in response to the next falling edge of the CLK waveform. Thus, the use of the delay circuit 16 ensures that the data in the slave stages of the shift register is stable when the latch circuits 7 are enabled.

It should be noted, however, that in an important application of the circuit of system 1, wherein high fidelity stereo audio signals are serially encoded to provide the DATA waveform, the delaying of the DATA waveforms to produce the DI-1 waveform reduces by half of a CK waveform cycle the amount of time available for the output of digital-to-analog converter 3 to "settle" after a conversion, since a subsequent sample and hold circuit receiving the DAC output is controlled by a non delayed signal.

The above-described system is capable of operating reliably with a CK cycle time of 10 megahertz. The high bandwidth of the ECL master-slave shift register bit circuits, and the ECL latch circuits, and the provision of the above-described ECL delay circuit are needed to achieve reliable serial inputting of the serial digitally encoded high fidelity information and feeding in parallel format into digital-to-analog converter 3. The described circuitry provides several unconventional circuit designs, including the TTL-to-ECL lateral PNP transistor differential input stages NPN driving current mirror circuits to achieve the needed high frequency complementary ECL clock signals and data signals, despite the low bandwidth inherent in present state-of-the-art lateral PNP transistors at a reasonable cost. Provision of the delay of the input data enables reliable latching of data from the slave stages of the shift register bits into the data latches without causing errors due to lack of adequate settling times for the DAC constant. A substantial reduction in IC chip cost and power consumption was effectuated by the simple expedient of shifting the relative positive supply voltages of the delay circuit and master-slave shift register bits in the high speed, high power latch circuits by one diode drop, allowing omission of the emitter follower stages that usually would be required. A savings of 10% in circuit power and a 20% reduction in chip area required for the shift register and latch circuitry was thereby achieved. Further savings in chip area and power dissipation are achieved by the simplified latch enable generation circuit.

While the invention has been described with reference to a particular embodiment thereof, those skilled in the art will be able to make various modifications to the described embodiment of the invention without departing from the true spirit and scope thereof.

I claim:

1. An integrated level shifting circuit for converting a first signal having TTL logic levels to corresponding complementary second and third signals having ECL logic levels, the TTL logic level signals being between a ground voltage on a ground voltage conductor and a positive first supply voltage on a first supply voltage conductor, the ECL logic levels being between the ground voltage and a negative second supply voltage on a second supply voltage conductor, the integrated level shifting circuit comprising in combination:

(a) means for providing a constant current;

(b) a first lateral PNP transistor having an emitter coupled to the constant current producing means and a base coupled to a first voltage reference conductor, the constant current producing means also being coupled to the first supply voltage conductor;

(c) a second lateral PNP transistor having an emitter coupled to the emitter of the first lateral PNP transistor and a base coupled to receive the first signal;

(d) a first diode having an anode coupled to a collector of the first lateral PNP transistor and a cathode coupled to the second supply voltage conductor, and a second diode having an anode coupled to the collector of the second lateral PNP transistor and a cathode coupled to the second supply voltage conductor;

(e) a first NPN current mirror transistor having an emitter coupled to the second supply voltage conductor and a base coupled to the anode of the first diode, and a second NPN current mirror transistor having an emitter coupled to the second supply voltage conductor and a base coupled to the anode of the second diode;

(f) first pull-up load circuit means coupled between the ground voltage conductor and a collector of the first NPN current mirror transistor, and second pull-up load circuit means coupled between the ground voltage conductor and a collector of the second NPN current mirror transistor; and (g) first coupling means for coupling the collector of the first NPN current mirror transistor to a first output conductor to produce the second signal on the first output conductor, and second coupling means for coupling the collector of the second NPN current mirror transistor to a second output conductor to produce the third signal on the second output conductor.

2. The integrated level shifting circuit of claim 1 wherein the first coupling means includes a first emitter follower including a first NPN emitter follower transistor having its base coupled to the collector of the first NPN current mirror transistor and an emitter coupled to the first output conductor, and wherein the second coupling means includes a second emitter follower including a second NPN emitter follower transistor having a base coupled to the collector of the second NPN current mirror transistor and an emitter coupled to the second output conductor.

3. The integrated level shifting circuit of claim 2 including a third NPN current mirror transistor having a base coupled to the base of the first NPN current mirror transistor, an emitter coupled to the second supply voltage conductor, and a collector coupled to the emitter of the first NPN emitter follower transistor, and also including a fourth NPN current mirror transistor having a base coupled to the base of the second NPN current mirror transistor, and an emitter coupled to the second supply voltage conductor, and a collector coupled to the emitter of the second NPN emitter follower transistor.

4. The integrated level shifting circuit of claim 3 wherein the constant current producing means includes a third lateral PNP transistor having its emitter coupled by a first resistor to the first supply voltage conductor, a base coupled to a second reference voltage conductor, and a collector coupled to the emitters of the first and second lateral PNP transistors.

5. The integrated level shifting circuit of claim 4 wherein the first pull-up load circuit means includes a second resistor having a first terminal coupled to the base of the first emitter follower transistor, a third resistor coupled to the base of the second emitter follower transistor, and first and second diodes coupled in series between the ground voltage conductor and the second terminals of the second and third resistors.

6. The integrated level shifting circuit of claim 1 wherein the first and second pull-up load circuit means each include first and second resistors, respectively, each having a first terminal coupled to the ground voltage conductor and a second terminal coupled to the collectors of the first and second NPN current mirror transistors, respectively, and wherein the first and second coupling means consist of conductors connecting the first and second output conductors to the collector of the first and second NPN current mirror transistors, respectively.

7. An integrated level shifting circuit for converting an input signal having TTL logic levels to a corresponding output signal having ECL logic levels, the TTL logic level signals being between a ground voltage on a ground voltage conductor and a positive first supply voltage on a first supply voltage conductor, the ECL logic levels being between the ground voltage and a negative second supply voltage on a second supply voltage conductor, the integrated level shifting circuit comprising in combination:
  (a) means for providing a constant current;
  (b) a first lateral PNP transistor having an emitter coupled to the constant current producing means and a base coupled to a first voltage reference conductor, the constant current producing means also being coupled to the first supply voltage conductor;
  (c) a second lateral PNP transistor having an emitter coupled to the emitter of the first lateral PNP transistor and a base coupled to receive the first signal;
  (d) a diode having an anode coupled to the collector of one of the first and second lateral PNP transistors and a cathode coupled to the second supply voltage conductor;
  (e) an NPN current mirror transistor having an emitter coupled to the second supply voltage conductor and a base coupled to the anode of the diode;
  (f) pull-up load circuit means coupled between the ground voltage conductor and a collector of the NPN current mirror transistor; and
  (g) coupling means for coupling the collector of the first NPN current mirror transistor to a first output conductor to produce the output signal on the output conductor.

8. The integrated level shifting circuit of claim 7 wherein the coupling means includes an emitter follower having an NPN emitter follower transistor having its base coupled to the collector of the NPN current mirror transistor and its emitter coupled to the output conductor.

9. An integrated level shifting circuit for converting a first signal having TTL logic levels to corresponding complementary second and third signals having ECL logic levels, the TTL logic level signals being between a ground voltage on a ground voltage conductor and a positive first supply voltage on a first supply voltage conductor, the ECL logic levels being between the ground voltage and a negative second supply voltage on a second supply voltage conductor, the integrated level shifting circuit comprising in combination:
  (a) means for providing a constant current;
  (b) a first lateral PNP transistor having an emitter coupled to the constant current producing means and a base coupled to a first voltage reference conductor, the constant current producing means also being coupled to the first supply voltage conductor;
  (c) a second lateral PNP transistor having an emitter coupled to the emitter of the first lateral PNP transistor and a base coupled to receive the first signal;
  (d) a first diode having an anode coupled to a collector of one of the first and second lateral PNP transistors and a cathode coupled to the second supply voltage conductors;
  (e) a first NPN current mirror transistor having an emitter coupled to the second supply voltage conductor and a base coupled to the anode of the first diode, and a second NPN current mirror transistor having an emitter coupled to the second supply voltage conductor and a base coupled to the base of the first NPN current mirror transistor;
  (f) pull-up load circuit means coupled between the ground voltage conductor and a collector of the first NPN current mirror transistor; and
  (g) an emitter follower including an NPN emitter follower transistor having its base coupled to the collector of the first NPN current mirror transistor and its emitter coupled to a first output conductor to produce the output signal on the first output conductor, the emitter of the first emitter follower transistor also being coupled to the collector of the second NPN current mirror transistor.

10. An integrated level shifting circuit for converting a first signal having a first set of logic levels to a second signal having a second set of logic levels, the integrated level shifting circuit comprising in combination:
  (a) means for providing a constant current;
  (b) a first lateral PNP transistor having an emitter coupled to the constant current producing means and a base coupled to a first voltage reference conductor, the constant current producing means also being coupled to a first supply voltage conductor;
  (c) a second lateral PNP transistor having an emitter coupled to the emitter of the first lateral PNP transistor and a base coupled to receive the first signal;
  (d) a first diode having an anode coupled to a collector of one of the first and second lateral PNP transistors and a cathode coupled to a second supply voltage conductor;
  (e) first NPN current mirror transistor having an emitter coupled to the second supply voltage conductor and a base coupled to the anode of the first diode;
  (f) first pull-up load circuit means coupled to a collector of the first NPN current mirror transistor; and
  (g) first coupling means for coupling the collector of the first NPN current mirror transistor to a first output conductor to produce the second signal on the first output conductor.

11. A circuit for converting a high speed, continuous serial stream of data pulses representing an analog signal to a reconstructed analog signal, the circuit comprising in combination:
  (a) an N-bit digital-to-analog converter circuit having N digital inputs and an output on which the reconstructed analog signal appears;

(b) N latch circuits each having an input, and each also having an output coupled to a corresponding digital input of the digital-to analog converter circuit;

(c) an N-bit shift register including N master-slave bit circuits, each having an input and each also having an output coupled to a corresponding input of a respective one of the latch circuits;

(d) means responsive to a continuous clock signal for continuously clocking the master-slave bit circuits to advance the stream of data pulses forward through the N-bit shift register;

(e) delay circuit means having an output coupled to an input of a first one of the master-slave bit circuits and having an input responsive to the stream of data pulses, for delaying the stream of data pulses by one-half of the period of the clock signal; and (f) means for enabling the latch circuits to accept the data stored in the slave stages of the N-bit shift register bit circuits every Nth pulse of the clock signal.

12. The circuit of claim 11 wherein the analog signal is a high fidelity audio signal, and wherein the data pulses have TTL logic levels, and wherein the latch circuits and the shift register bit circuits are ECL logic circuits, and the clock signal has TTL logic levels.

13. The circuit of claim 11 including a TTL-to-ECL level shifting circuit for receiving the clock signal and generating first and second internal clock signals having ECL logic levels and applying them to the master-slave bit circuits of the N-bit shift register to shift the data pulses through the N-bit shift register, the first and second internal clock signals being logical complements of each other, wherein the level shifting circuit includes a differential input stage including first and second emitter-coupled lateral PNP transistors, a base of the first lateral PNP transistor being coupled to a reference voltage, the base of the second lateral PNP transistor receiving the stream of data pulses, the emitters of the first and second lateral PNP transistors being coupled to a constant current source, the collectors of the first and second lateral PNP transistors being connected to the anodes of first and second diodes having their cathodes connected to a negative supply voltage conductor, the anode of the first diode being connected to the bases of first and second current mirror transistors having their collectors coupled, respectively, to the base and emitter of a first emitter follower transistor, the base of the first emitter follower transistor being couple to a first pull-up resistor, the anode of the second diode being coupled to the bases of third and fourth current mirror transistors having their collectors coupled, respectively, to the base and emitter of a second emitter follower transistor, the base of the second emitter follower transistor being connected to a second pull-up resistor, the emitters of the first and second emitter follower transistors, respectively, producing the first and second internal clock signals.

14. The circuit of claim 13 wherein the delay circuit includes first and second emitter-coupled NPN transistors and third and fourth emitter-coupled NPN transistors, the emitters of the first and second emitter-coupled transistors being coupled to a first NPN gating transistor having its base connected to receive the logical complement of first internal clock signal, the emitters of the third and fourth NPN emitter-coupled transistors being connected to a second NPN gating transistor having its base connected to receive the internal clock signal, the emitters of the first and second gating transistors being connected to a constant current source, the bases of the first and second emitter-coupled NPN transistors being connected, respectively, to internal data and data complement signals, the collectors of the first and third NPN emitter-coupled transistors being coupled to a first load resistor, the collectors of the second and fourth emitter-coupled NPN transistors being coupled to a second load resistor, the bases and collectors of the third and fourth emitter-coupled NPN transistors being cross-coupled, the collectors of the first and second emitter-coupled NPN transistors being coupled to inputs of the first master-slave shift register bit.

15. The circuit of claim 13 wherein the latch circuit includes a pair of load resistors connected to a digital ground conductor, and wherein the load resistors of the delay circuit and the load resistors of the N-bit shift register are connected to the cathode of a level shifting diode having its anode connected to the digital ground conductor, wherein the outputs of the slave stage of each of the master slave bit circuits are connected directly, without emitter followers, to the inputs of the latch circuits.

16. The circuit of claim 15 wherein the latch enabling means includes a latch enable control circuit that produces an enable pulse of duration approximately equal to the duration of a clock pulse of the clock signal a predetermined amount of time after the negative-going edge of every Nth pulse of the clock signal, the circuit also including a latch enable pulse generating circuit receiving a latch enable control signal and responsive to the clock level shifting circuit to produce a latch enable signal that occurs while the data in the slave stages of the N master slave circuits is stable every Nth clock pulse.

17. The circuit of claim 16 wherein the time uncertainty between the latch enable control pulse and the negative-going edge of the clock signal is sufficiently large that there would be a substantial danger of data in the slave stages of the master slave shift register bit circuits changing during the latch enable signal if the stream of data pulses is not delayed by one-half of the clock signal period.

18. An ECL circuit for producing an enable pulse of relatively short duration in response to an edge of a relatively long duration control pulse of a control signal, the circuit comprising in combination:

(a) a master-slave flip-flop circuit including a master stage and a slave stage, the master stage including
 i. first and second latch transistors having their emitters coupled together;
 ii. first and second load resistors each having a first terminal coupled to a first supply voltage conductor and a second terminal coupled to the collectors of the first and second latch transistors, respectively;
 iii. first and second emitter follower transistors having their bases coupled to the second terminals of the first and second load resistors, respectively, and their emitters coupled to the bases of the second and first latch transistors, respectively;
 iv. a first control transistor having its base coupled to receive the control signal, its collector coupled to the second terminal of the first load resistor, and its emitter coupled to a first constant current source; the slave stage including i. first and second input transistors having their emitters coupled together and to the emitters of the first and second latch transistors and to a second control transistor having its base coupled to receive the logical complement of the control signal and its emitter coupled to the first current source, the base of the first input transistor being coupled to the base of the first latch transistor, the base of the second input transistor being coupled to the base of the second latch transistor;

ii. third and fourth load resistors each having a first terminal coupled to the first supply voltage conductor and a second terminal coupled to the collectors of the first and second input transistors, respectively;

iii. third and fourth emitter follower transistors having their bases coupled to the second terminals of the third and fourth load resistors, respectively, and their emitters coupled first and second enable output conductors, respectively, the enable pulse being produced on the second enable output conductor and a logical complement of the enable pulse being produced on the first enable output conductor;

iv. third and fourth latch transistors having their emitters coupled together and to a third control transistor having its base and emitter coupled to the base and emitter of the first control transistor, respectively, the collectors of the third and fourth latch transistors being coupled to the second terminals of the fourth and third load resistors, respectively, the bases of the third and fourth latch transistors being coupled to the first and second enable output conductors, respectively; and (b) an ANDing circuit including i. a first transistor having its base coupled to the second enable output conductor and its collector coupled to the second terminal of the second load resistor;

ii. a second transistor havings its emitter coupled to the emitter of the first transistor, its base coupled to the first enable output conductor, and its collector coupled to the first supply voltage conductor; and iii. a third transistor having its base coupled to receive a clock signal, its collector coupled to the emitters of the first and second transistors, and its emitter coupled to a second supply voltage conductor, the width of a pulse of the clock signal being approximately equal to the relatively short duration.

19. The ECL circuit of claim 18 wherein all of the transistors recited are NPN transistors.

20. The ECL circuit of claim 19 wherein each of the first, second, third, and fourth emitter follower transistors has its emitter coupled, respectively, to a separate constant current source.

21. The ECL circuit of claim 20 including means for producing the control signal and the logical complement of the control signal, each having ECL logic levels, in response to a single external control signal having TTL logic levels.

22. The ECL circuit of claim 21 wherein the clock signal is an internal clock signal generated in response to an external clock signal having TTL logic levels by means of a level shifting circuit.

23. An ECL circuit including:

(a) a first stage including i. first and second transistors having their bases coupled to first and second input conductors, respectively, and their emitters coupled to a first constant current source;

ii. first and second load resistors each having a first terminal coupled to a first supply voltage conductor having a first voltage thereon, each also having a second terminal coupled to the collectors of the first and second transistors, respectively;

iii. first and second emitter followers each having an input coupled to the collectors of the first and second transistors, respectively, each also having an output connected to first and second output conductors, respectively;

(b) a diode having an anode connected to the first supply voltage conductor and a cathode connected to a second supply voltage to produce a second voltage thereon which is one diode drop below the first voltage;

(c) a second stage including i. third and fourth transistors having their emitters coupled to a second constant current source, the collector of the third transistor being coupled directly to the base of the fourth transistor, the collector of the fourth transistor being coupled directly to the base of the third transistor;

ii. third and fourth load resistors each having a first terminal coupled to the collectors of the third and fourth transistors, respectively, each also having a second terminal coupled to the second supply voltage conductor; and (d) means for causing the second stage to produce ECL voltage swings of approximately 0.8 volts on the collectors of the third and fourth transistors, whereby saturation of the first and second transistors is avoided.

* * * * *